United States Patent
Ekwall et al.

(10) Patent No.: US 6,259,616 B1
(45) Date of Patent: Jul. 10, 2001

(54) VSC-CONVERTER

(75) Inventors: Olle Ekwall; Ingemar Blidberg, both of Ludvika; Björn Jacobson, Grängesberg; Bo Bijlenga, Skultuna; Henrik Spjuth, Ludvika, all of (SE)

(73) Assignee: ABB AB, Vasteras (SE)

( * ) Notice: Subject to any disclaimer, the term of this patent is extended or adjusted under 35 U.S.C. 154(b) by 0 days.

(21) Appl. No.: 09/554,503

(22) PCT Filed: Sep. 6, 1999

(86) PCT No.: PCT/SE99/01543

§ 371 Date: May 16, 2000

§ 102(e) Date: May 16, 2000

(87) PCT Pub. No.: WO00/17996

PCT Pub. Date: Mar. 30, 2000

(30) Foreign Application Priority Data

Sep. 18, 1998 (SE) .................................................. 9803172

(51) Int. Cl.[7] ................................................ H02M 7/5387

(52) U.S. Cl. ............................................................ 363/132

(58) Field of Search .................................. 363/16, 17, 55, 363/56, 97, 98, 131, 132

(56) References Cited

U.S. PATENT DOCUMENTS

| | | | |
|---|---|---|---|
| 5,684,688 | * 11/1997 | Rouaud et al. | 363/132 |
| 5,910,892 | * 6/1999 | Lyons et al. | 363/98 |
| 6,028,779 | * 2/2000 | Sakamoto et al. | 363/55 |
| 6,101,114 | * 8/2000 | Kijima et al. | 363/132 |

\* cited by examiner

*Primary Examiner*—Matthew Nguyen
(74) *Attorney, Agent, or Firm*—Dykema Gossett PLLC

(57) ABSTRACT

In a VSC-converter for converting direct voltage to alternating voltage and conversely at least one phase leg (2) is arranged according to a NPC-connection. At least two of the four current valves (3–6) and the clamping rectifying members (10, 11) thereof are arranged close to each other and so that commutation currents generated on commutation of the converter therein will flow in substantially opposite directions.

23 Claims, 4 Drawing Sheets

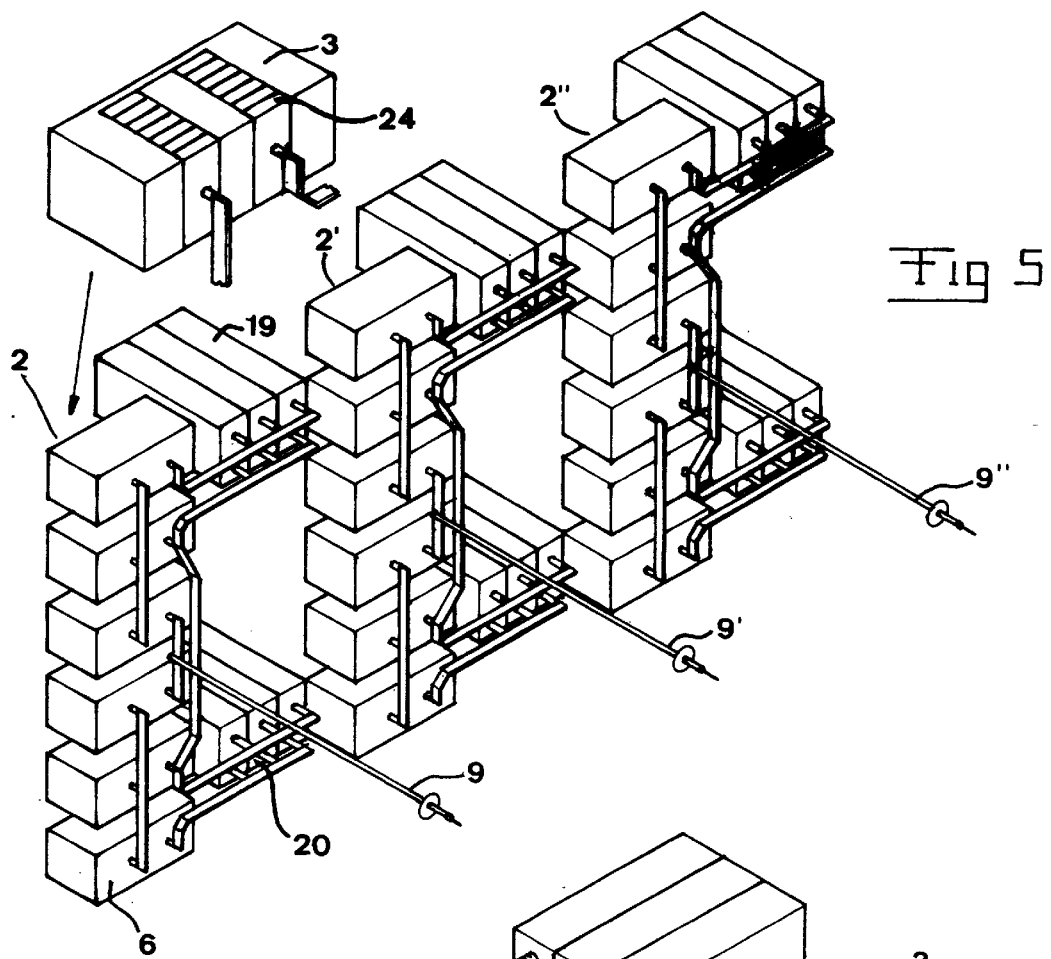
Fig 5
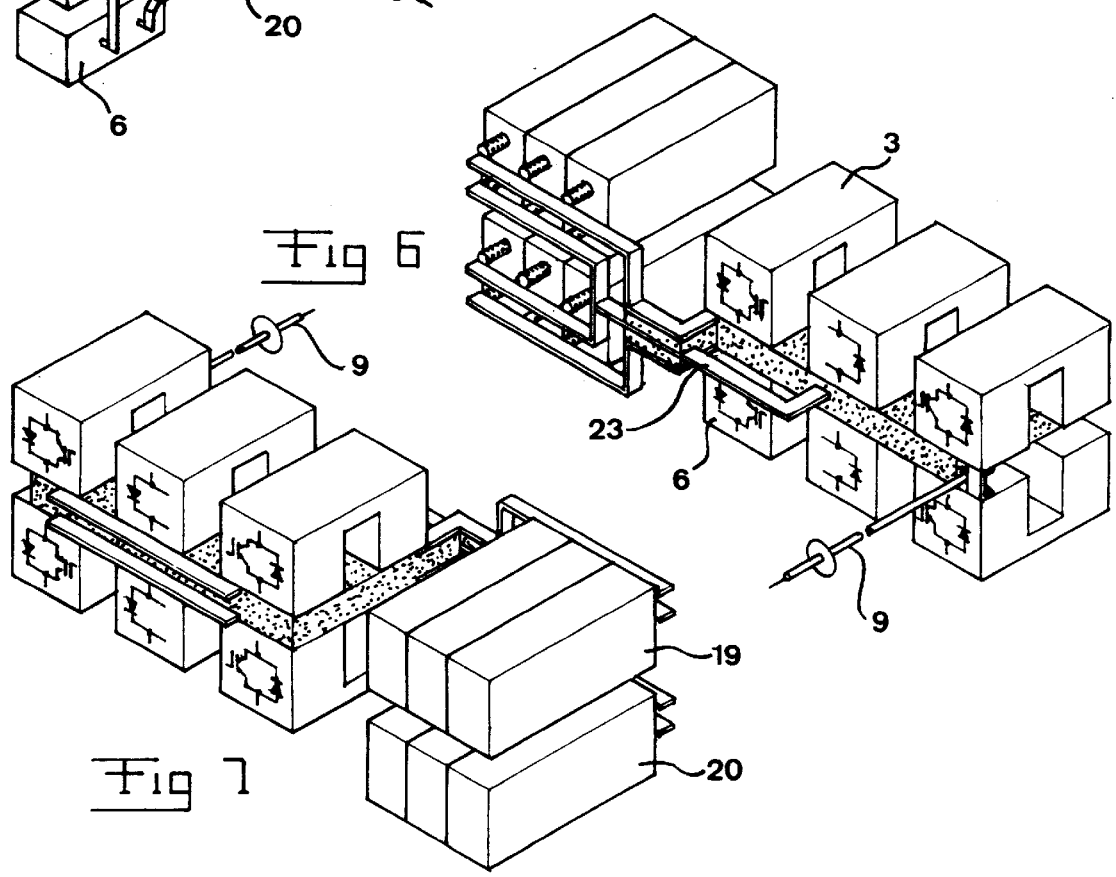
Fig 6
Fig 7

VSC-CONVERTER

FIELD OF THE INVENTION AND PRIOR ART

The present invention relates to a VSC-converter for converting direct voltage into alternating voltage and conversely and which comprises at least one phase leg with an NPC-connection, i.e. four current valves connected in series, which consist of at least one semiconductor device of turn-off type and a first rectifying member connected in anti-parallel therewith, in which a point on the phase leg between two inner valves of the series connection is intended to be connected to a phase of an alternating voltage network and the opposite ends of the phase leg are intended to be connected to a pole conductor each of a direct voltage network or a direct voltage intermediate link, and in which a series connection of two second so called clamping rectifying members directed in the same direction with respect to said series connection as the first rectifying members are connected between on one hand a point between one of the outer valve of the series connection and the adjacent inner valve and on the other a point between the other of the outer valves in the series connection and the adjacent inner valve, and a midpoint between the two clamping rectifying members is connected to a zero potential defined by capacitors connected in series between said pole conductors.

Such a VSC-converter for connection between a direct voltage network and an alternating voltage network has recently become known through the thesis "PWM and control of two and three level High Power Voltage Source Converters" by Anders Lindberg, Kungliga Tekniska Högskolan, Stockholm, 1995, in which publication a plant for transmitting electric power through a direct voltage network for high voltage direct current (HVDC) while utilizing such converters is described. Before the issuance of said thesis plants for transmitting electric power between a direct voltage network and an alternating voltage network have been based upon the use of line-commutated CSC(Current Source Converters)-converters in stations for power transmission. However, in this thesis a totally new concept is described, which is based on the use of VSC(Voltage Source Converter)converters for forced commutation instead for transmitting electric power between a direct voltage network being voltage-stiff therethrough, in the present case for high voltage direct current, and alternating voltage networks connected thereto, which offers several important advantages with respect to the use of line-commutated CSC-converters in HVDC, of which it may be mentioned that the consumption of active and reactive power may be controlled in dependency of each other and there is no risk of commutation failures in the converter and thereby no risk of commutation failures between different HVDC links, which may take place in line-commutated CSC's. Furthermore, there is a possibility to feed a weak alternating voltage network or a network without a generation of its own (a dead alternating voltage network). There are also further advantages.

The invention is not restricted to this application, but the converter may just as well be intended for conversion in a SVC, in which case the direct voltage network is replaced by a DC-intermediate link. "Network"is also to be given a very broad sense, and it does not have to be a question about any such networks in the real meaning of that word. However, the problems of the invention will now be illuminated for exactly this application, although the problem is common to all conceivable applications within the scope of the invention. When using a converter of the type mentioned in the introduction instead of a current-stiff CSC-converter a new problem not present in the latter is created, which will now be explained by reference to FIGS. 1, 2 and 3. Firstly, it may be mentioned that the advantage of using a so called NPC(Neutral Point Clamped)-connection, which accordingly means that the phase terminal may be provided with positive and negative voltage from the respective pole conductor as well as zero voltage, with respect to a so called two-pulse bridge, or in the case of three phases a so called six-pulse bridge, is that a lower switching frequency may used, which results in lower losses and a higher efficiency. However, this still suffers from said problems not yet described. A VSC-converter 1 of the type defined in the introduction is shown in FIG. 1 and it has a phase leg 2 with four current valves 3–6 connected in series, which each consists of at least one semiconductor device of turn-off type, such as an IGBT 7, and a first rectifying member in the form of a diode 8 connected in anti-parallel therewith. A point on the phase leg between the two inner valves 4, 5 in the series connection is intended to be connected to a phase 9 of an alternating voltage network. A series connection of two second so called clamping rectifying members 10, 11 in the form of diodes directed in the same direction with respect to said series connection as the first rectifying members are connected between on one hand a point 12 between one outer valve 3 in the series connection and the inner valve 4 adjacent thereto and on the other a point 13 between the outer valve 6 of the series connection and the inner valve 5 adjacent thereto with a midpoint 14 between the two clamping rectifying members connected to a zero potential 15 defined by capacitors 19, 20 connected in series between a positive pole conductor 16 and a negative pole conductor 17 of the direct voltage network 18. It is illustrated in FIGS. 2 and 3 what is happening upon commutation, i.e. when the voltage output on the phase terminal 9 is changed. It is imagined that in the case shown in FIG. 2 current flows from the negative pole conductor 17 of the direct voltage network through the diodes of valves 5 and 6 to the phase terminal 9, which then gets a voltage $-U_d$ of the pole conductor 17. The semiconductor devices 7 of the current valves 3 and 4 are turned off. If a commutation now takes place, so that the semiconductor device in the current valve 4 is turned on, the current will then be commutated to go through the clamping diode 10 and the current valve 4 to the phase terminal 9, which then receives zero potential. This will result in a commutation current according to the loop 21, which is shown in FIG. 2. It is illustrated in FIG. 3 what is happening if the first semiconductor devices of the current valves 5 and 6 are turned on and thereby the current flows from the phase terminal 9 to the pole conductor 17 and thereby the phase terminal has the potential $-U_d$ and then a commutation takes place, so that the semiconductor device in the current valve 6 is turned off and the current is instead lead through the current valve 5 and the clamping diode 11 to the point 14 and through the capacitor 20 to the pole conductor 17, so that the phase output 9 receives zero potential. A commutation current according to a smaller commutation loop 22 is then resulting. The commutation current will flow in the respective commutation loop in the opposite direction should the commutation take place in the opposite order to the one described. Similar commutation loops, i.e. a large and a small loop also exist upon commutation through the upper capacitor 19. The commutation times of such a VSC-converter are short and comparatively large time differential coefficients of the current are created, which makes it desired to lower the inductance in the commutation circuit, i.e. in the very phase leg and the line connected between the poles of the direct voltage network with capacitors for defining the direct voltage, to a level being as low as possible so as to avoid unnecessarily high over-voltages and thereby losses upon said commutation.

SUMMARY OF THE INVENTION

The object of the present invention is to provide a VSC-converter of the type defined in the introduction, in which the problem mentioned above has been solved in a satisfying way.

This object is according to the invention obtained by the fact that at least two of the current valves and the clamping rectifying members are arranged close to each other and so that commutation currents generated upon commutation of the converter therein will flow in substantially opposite directions.

By ensuring that such commutation currents flow close to each other and in opposite directions in this way the inductance of the commutation circuit will be reduced considerably, since the currents passing each other will generate magnetic fields rotating in the opposite direction and partially cancelling each other out. The commutation losses may thereby be reduced to a low, acceptable level.

According to a preferred embodiment of the invention the current valves and the clamping rectifying members are arranged in stacks arranged in pairs and so that commutation currents generated upon commutation of the converter will flow in substantially opposite directions in stacks belonging to the same pair. Such an arrangement of stacks in pairs leads to a low inductance value of the commutation circuit and thereby low commutation losses.

According to another preferred embodiment of the invention each current valve and clamping rectifying member is formed by one or several stacks of substantially identical units connected in series, and the stacks are designed with a large width and adjacent stacks are arranged at short mutual distances. By utilizing the so-called ribbon cable technique in this way a low inductance of the commutation circuit with the advantages mentioned above as a consequence thereof is obtained.

According to another preferred embodiment of the invention for at least one of the following three pairs the two parts included therein are arranged close to each other and so that commutation currents generated upon commutation of the converter in those belonging to the same pair will flow in substantially opposite directions: a) a first outer current valve and the clamping rectifying member connected between the second outer current valve and the inner current valve adjacent thereto, b) the second outer current valve and the clamping rectifying member connected between the first outer current valve and the inner current valve adjacent thereto and c) the two inner current valves. These different pairs will belong to the larger commutation circuit 21 shown in FIG. 2 or the opposite large commutation circuit going through the current valves 3, 4, 5 and the clamping rectifying member 11. It is of particular importance that the inductance of the large commutation circuit is reduced in this way, since it is this inductance that is the highest of the two commutation circuits as a consequence of the longer way to flow for the commutation current in this circuit and the larger area enclosed by such a circuit.

According to another preferred embodiment of the invention, which constitutes an advantageous further development of the embodiment last mentioned, all three pairs a), b) and c) have their pair parts arranged close to each other and with said commutation current in each pair oppositely directed when they flow in a large commutation loop through an outer current valve, the inner current valve adjacent thereto, the second inner current valve and the clamping rectifying member connected to the latter. This results in a particularly low inductance of the two large commutation circuits and commutation losses at a low acceptable level.

According to another preferred embodiment of the invention the four current valves and the clamping rectifying members are arranged substantially in a row one after the other with a clamping rectifying member arranged between each outer valve of the series connection and the inner valve connected thereto. By arranging the four current valves and the clamping rectifying members in this way in a row the commutation circuits 21, 22 mentioned above may be made small, i.e. the area enclosed by the respective commutation circuit gets very small, and the inductance of the commutation circuit is reduced with reducing area enclosed by the circuit. The commutation circuits will also by such an arrangement in a row be very narrow and the inductance thereof will thereby be reduced and the currents passing each other will generate magnetic fields rotating in opposite directions and partially cancelling each other out. The commutation losses will thereby be brought down to a low acceptable level.

According to another preferred embodiment of the invention the current valves and the clamping rectifying members are adapted to extend substantially perpendicularly to the extension direction of said row. The row may hereby be made comparatively short and the length of the commutation circuit will thereby be reduced, i.e. the conducting distance of the current will be shorter, which reduces the inductance, since this is proportional to this length.

According to another preferred embodiment of the invention one outer current valve in said series connection and the inner current valve located most remotely with respect thereto are arranged substantially in parallel with each other, and the two other current valves are arranged substantially in parallel with each other and making an angle of substantially 180° with respect to the two valves first mentioned. It is hereby obtained that the commutation circuits get as narrow as possible, i.e. the area enclosed thereby gets as small as possible and thereby the inductance low.

According to another preferred embodiment of the invention the two clamping rectifying members are arranged with the conducting directions thereof making an angle of substantially 180° with each other. This means that the two commutation circuits of the respective half of a NPC-connection may be closed through the respective clamping rectifying member in such a way that the circuit will be as short as possible and encloses a very small area.

According to another preferred embodiment of the invention, which constitutes a further development of the embodiment last described, the respective clamping rectifying member is arranged with the conducting direction thereof making an angle of substantially 180° with respect to the conducting direction of the first rectifying member in the outer current valve adjacent thereto. Lengths and areas enclosed of and by the commutation circuits with minimal dimensions are obtained thereby, especially the smaller commutation circuit with the advantages appearing above as a consequence.

According to another preferred embodiment of the invention said row is folded by substantially 180° in the region of said phase terminal, so that the outer current valves come close to each other and the phase leg gets compact. The VSC-converter may in this way be placed in a very volume-saving way, and in the case of an arrangement of said row in vertical direction the height thereof may in this way be reduced.

According to another preferred embodiment of the invention said capacitors are two to the number and one of them is connected to each end of said row with one plate to the outer current valve located there and the other plate to a clamping rectifying member adjacent thereto. This embodiment in combination with the preceding one means that in the case of a standing row the two capacitors will be placed adjacent to each other in the ground plane. This location of the capacitors makes the commutation circuits short, in particular the smaller commutation circuits.

According to another preferred embodiment of the invention each current valve consists of a plurality of semiconductor devices of turn-off type connected in series and rectifying members connected in anti-parallel therewith arranged so that they form a substantially U-shape. The inductance in the respective current valve is in this way reduced thanks to the currents passing each other.

According to another preferred embodiment of the invention, which constitutes a preferred further development of the previous embodiment, the legs of said U are thick and the distance therebetween comparatively small for reducing the inductance of the respective current valve. By constructing the respective current valve in this way according to the ribbon cable principle the inductance may be reduced to low levels.

According to another preferred embodiment of the invention the different connections between the current valves and the clamping rectifying members and capacitors of the converter are achieved by low inductance rails, i.e. thin rails having a comparatively large width transversely to the longitudinal extension thereof. The inductance of the commutation circuits is hereby reduced further.

According to another preferred embodiment of the invention the converter is intended to be connected to a direct voltage network for high voltage direct current (HVDC). A series connection of a comparatively high number, well about thirty, of semiconductor devices and thereby of rectifying members connected in anti-parallel therewith is required for forming a current valve in this application, so that the invention is especially well suited for exactly this application.

Further advantages as well as advantageous features of the invention will appear from the following description and the other dependent claims.

BRIEF DESCRIPTION OF THE DRAWINGS

With reference to the appended drawings, below follows a description of preferred embodiments of the invention cited as examples.

In the drawings:

FIG. 5 illustrates a VSC-converter of the type illustrated in FIG. 4, but all three phase legs are shown here, FIGS. 6 and 7 are views illustrating a VSC-converter according to said preferred embodiment of the invention, in which the figures show it from different directions.

DETAILED DESCRIPTION OF PREFERRED EMBODIMENTS OF THE INVENTION

Figure 1:
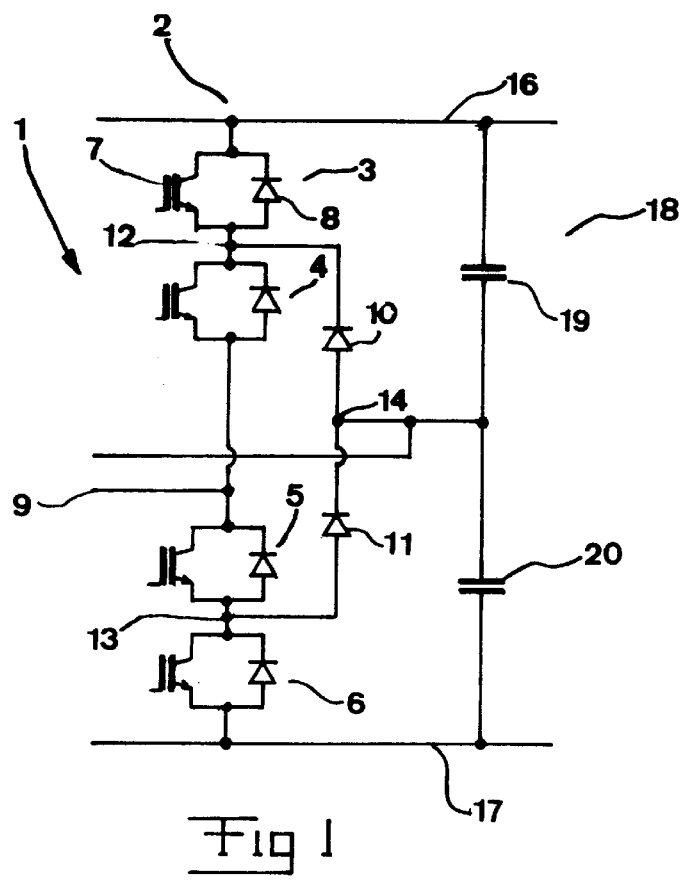
FIG. 1 is a schematic circuit diagram illustrating the construction of a VSC-converter of the type according to the invention, but this has only been shown for one phase.

FIG. 1 has already been discussed, and it may here be noted that it schematically illustrates the construction of a VSC-converter of NPC-type connected between a direct voltage network for high voltage direct current (HVDC= High Voltage Direct Current), or only a DC intermediate link (SVC operation), and a three-phase alternating voltage network, although only one phase 9 and a phase leg 2 are shown in FIG. 1, but two additional such phase legs are in practice connected in parallel with the phase leg 2 between the two poles 16 and 17 of the direct voltage network. Each phase leg of the converter has four so called current valves, which consist of units of breakers 7 of turn-on and turn-off type connected in series, preferably in the form of IGBT's, and rectifying members connected in anti-parallel therewith, i.e. members being conducing in one direction and blocking in the opposite direction, in the form of diodes 8. A large number of such units and thereby IGBT's may be connected in series in one single valve so as to be turned on and turned off simultaneously so as to act as one single breaker or switch, where the voltage over the valve is distributed on the different breakers connected in series. The control of the breakers takes place through pulse width modulation (PWM). Furthermore, the clamping diodes 10 and 11 already described are used for assisting in clamping or fixing the voltage over valves not conducting, so that when for example the valves 5 and 6 are turned on and the voltage $-U_d$ is applied on the phase terminal 9 the diode of the current valve 3 and the diode 10 "clamp" the point 12 to a potential between 0 and $+U_d$ in a way known.

The inductance problem present in a converter of this type have thoroughly been discussed in the introductory portion of the description and are not to be repeated here, but it may be noted that as a consequence of the high switching frequencies used in this form of converters, one or a few kHz, opposite to the switching frequencies in the order of 50 Hz of CSC-converters, the time differential coefficients of the commutation current will be very high, and it is therefore essential to try to reduce the inductance of the commutation circuit so as to reduce the over-voltages and the losses resulting after all. Some embodiments of converters according to the invention falling within the scope of the invention will now be described with reference to FIGS. 4–9.

Figure 4:
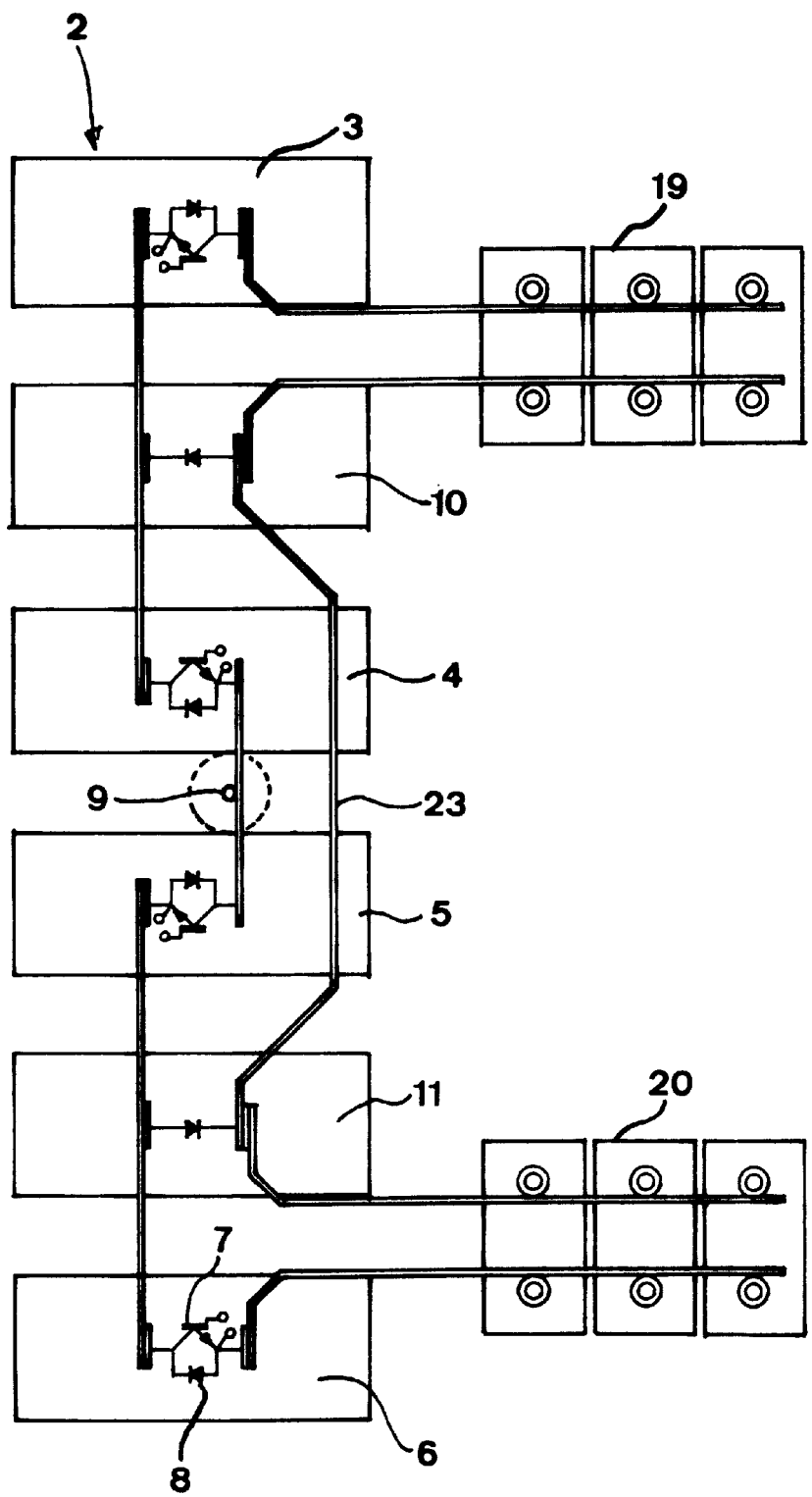
FIG. 4 illustrates schematically the construction of a VSC-converter according to a first preferred embodiment of the invention.

It is shown in FIG. 4 how the different current valves 3–6 and clamping diodes 10, 11 are arranged substantially in a row one after the other, in which a clamping diode is placed between the respective outer valve in the series connection and the inner valve connected thereto, such as the diode 11 between the current valves 5 and 6. The current valves and the clamping diodes are arranged to extend substantially perpendicularly to the direction of extension of the row. As appears, the current valves 3 and 5 are directed substantially in parallel with each other, while the current valves 4 and 6 are directed substantially in parallel with each other, but making an angle of substantially 180° with the two current valves first mentioned. Furthermore, the two clamping diodes directed with their conducting directions in opposite directions and with the conducting direction in the opposite direction to the conducting direction of the diode 8 in the outer current valves 3 and 6, respectively, adjacent thereto. The different connections between the current valves and the clamping diodes as well as the capacitors 19, 20 are achieved by low inductance rails 23, i.e. thin rails having a comparatively large width transversely to the longitudinal extension thereof. This shape of these rails appears better from FIGS. 5–7. In the embodiment according to FIG. 4 the connections 23 between the current valves and the clamping diodes for at least the main part of the total length thereof are substantially in parallel with the longitudinal direction of said row.

The commutation circuits get through this construction of the current valve a comparatively short length and will enclose a small area, so that the inductance thereof will be low. This is understood by looking on FIG. 4, since the corresponding commutation circuits in FIGS. 2 and 3 will run according to the following: If we consider the large commutation circuit to start on the top, it runs there, as seen in FIG. 4, to the left through the clamping diode 10, then downwardly to the current valve 4, through the semiconductor device thereof and then downwardly to the phase terminal 9, further to the current valve 5 and through the semiconductor device thereof to the left and then straight downwardly to the current valve 6, through the semiconductor device thereof to the right, then to the capacitor 20 and then to the left and after that straight upwardly through the neutral rail 23 to the clamping diode 10. Thus, this circuit gets very narrow and encloses a small area. The short commutation circuit will run from the left to the right through the clamping diode 11, then to the capacitor 20, and after that to the left through the diode of the current valve 6 for running upwardly to the diode 11 again. There are also corresponding loops through the upper capacitor 19.

It is illustrated in FIG. 5 what a converter connected to a three-phase alternating voltage network with the construction according to FIG. 4 for each phase may look like. Thus, three phase terminals 9, 9', 9", one for each phase leg 2, 2', 2", exist here. On the top to the left in FIG. 5 the construction of a current valve or clamping diode is illustrated, and it appears that these consist of a number of units connected in series, which are arranged so that they form substantially a U-shape. The legs 24 of the U are thick and the distance therebetween is comparatively short for reducing the inductance of the respective current valve or clamping diode. Accordingly, "clamping diode" or "clamping rectifying member" are also to be interpreted as it may be formed by an amount of such diodes or members connected in series.

In the embodiment shown in FIG. 5 the phase leg is stretched and directed substantially vertically, but it is also possible to fold the row, preferably at the phase terminal, and preferably by an angle of substantially 180°, so that the phase leg with the capacitors gets the appearance appearing from FIGS. 6 and 7, in which the second parts are shown in these two Figures, but from different directions. Hereby the converter becomes very compact, and in the case it is arranged in vertical direction the height may be reduced substantially, and the two capacitors may then be arranged at the ground level.

Figure 2:
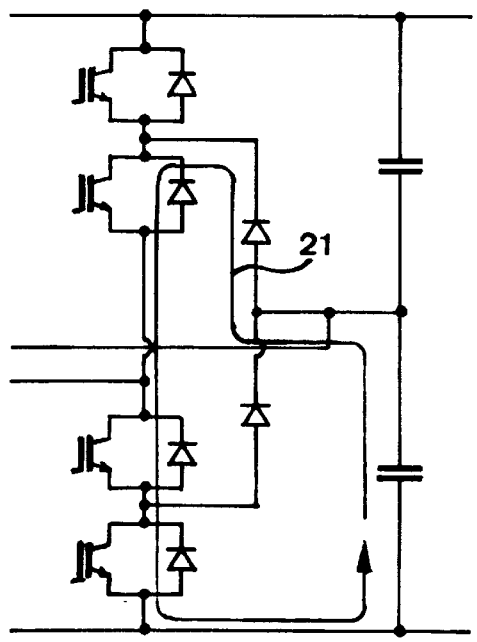
FIGS. 2 and 3 are views corresponding to FIG. 1 illustrating how a commutation circuit for a commutation current may be formed for two different possible commutations.
Figure 3:
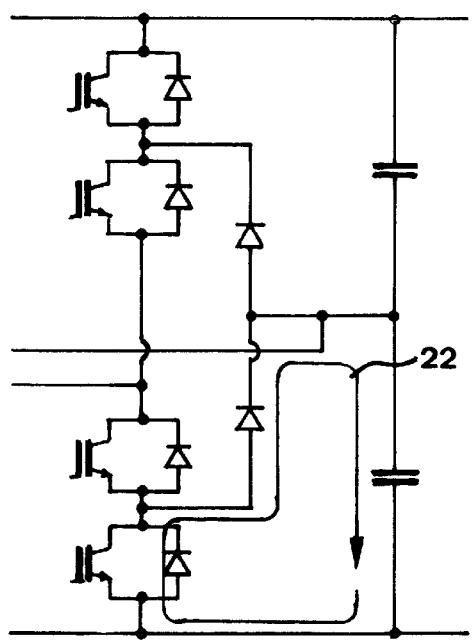
Figure 8:
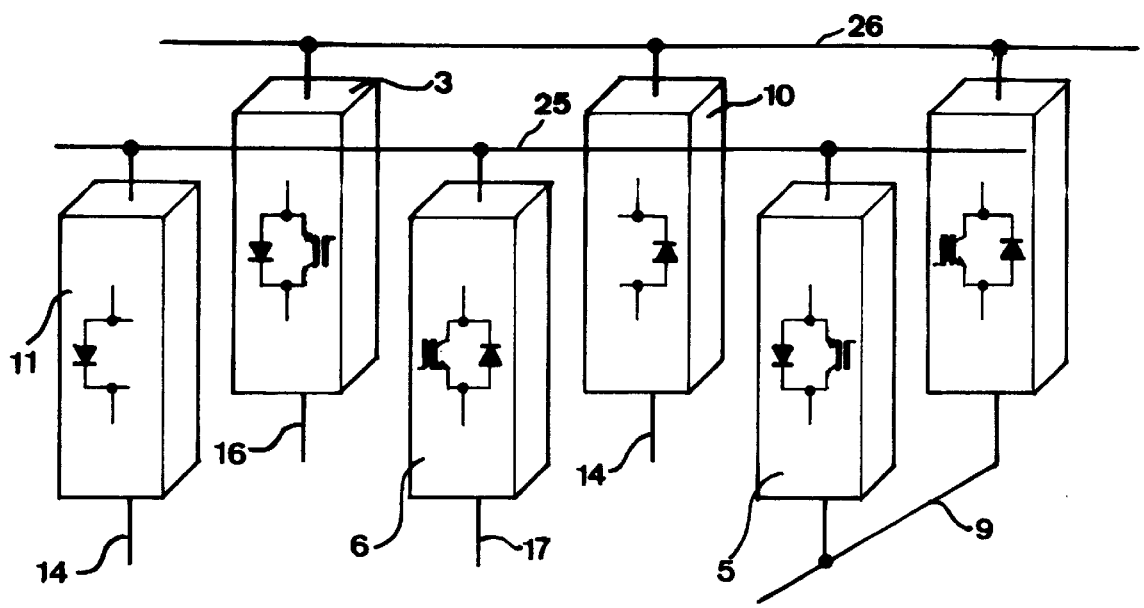
FIG. 8 illustrates schematically the construction of a VSC-converter according to a third preferred embodiment of the invention.

A very preferred embodiment of the invention is illustrated in FIG. 8, in which the four current valves and clamping rectifying members are arranged in three pairs of stacks arranged close to each other with the direction of the commutation currents flowing therethrough oppositely directed for the large commutation loop shown in FIG. 2 and the large commutation loop running through the upper current valve shown in FIG. 2. More exactly, the current valve 3 and the clamping rectifying member 11 form a pair, the current valve 6 and the clamping rectifying member 10 another pair, while the current valve 5 and the current valve 4 form a third pair. Such an arrangement of the current valves and the clamping rectifying members in stacks arranged in pairs with the direction of the commutation current mentioned in the large commutation loop results in a very low inductance for this commutation loop and the commutation losses will thereby be kept at a low level. It is then particularly advantageous if these stacks belonging to the same pair are arranged close to each other and are given a large width so as to utilize the so-called ribbon cable principle.

Figure 9:
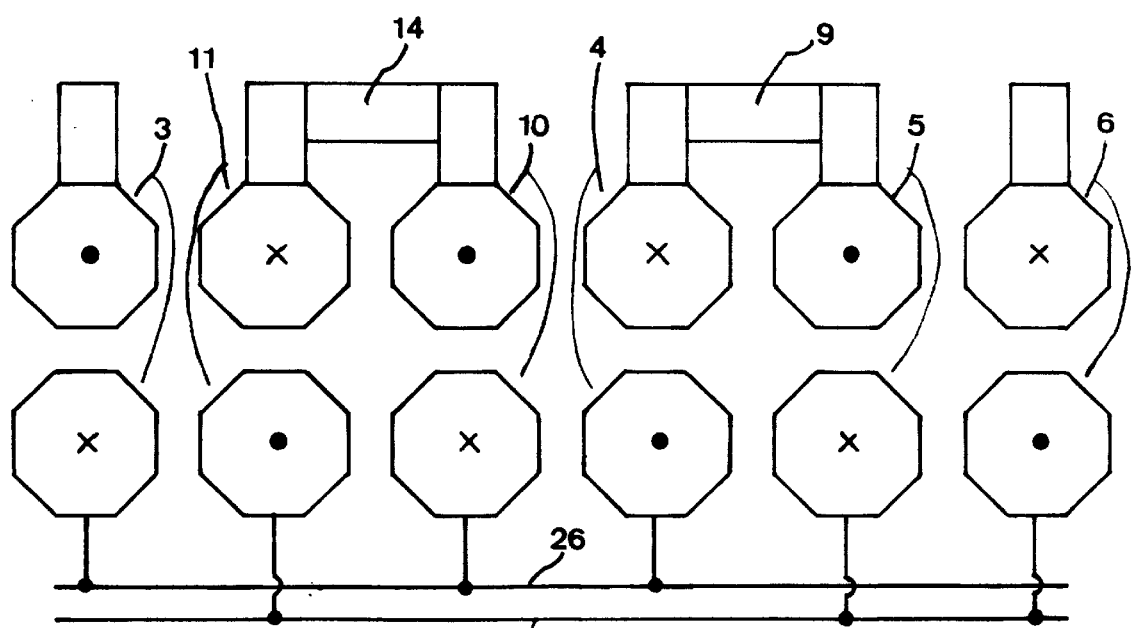
FIG. 9 illustrates schematically a VSC-converter according to a fourth preferred embodiment of the invention.

A converter according to a fourth preferred embodiment is schematically illustrated in FIG. 9. Each current valve and clamping rectifying member, respectively, is in this converter formed by two stacks, in which these are shown from the top and the direction of the commutation current therethrough is shown by X (into the drawing) and. (out of the drawing). The commutation currents will in this way flow in opposite directions for an amount of adjacent stacks and the inductance of the commutation circuits may thereby be reduced. With respect to the large commutation loop, it appears that also here 3 and 11 as well as 4 and 5 form pairs, while 10 and 6 are not adjacent to each other. The commutation currents through the rails 25 and 26 will over large parts of the extension thereof run in opposite directions, so that the inductance also of that part of the commutation circuits will be low.

Figure 10:
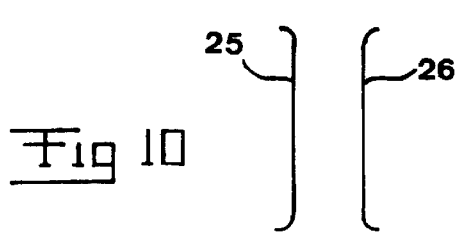
FIG. 10 illustrates an advantageous embodiment and arrangement of conducting rails of the VSC-converter according to the invention.

It is illustrated in FIG. 10 how these rails are preferably designed and arranged, namely so that they are wide and arranged on a small mutual distance for utilizing the so-called ribbon cable principle.

Converters of the type according to the invention may be used both for transmitting active and reactive power by generating losses being small in this context.

The invention is of course not in any way restricted to the preferred embodiments described above, but many possibilities to modifications thereof will be apparent to a man skilled in the art without departing from the basic idea of the invention, such as this appears from the claims.

For example "substantially perpendicular to" and "making an angle of substantially 180° with respect to" in the claims are to be given a broad sense and means that the current valves and the clamping rectifying members are adapted to extend transversely to the longitudinal extension of said row and that these are directed in mainly opposite directions, respectively, and that the angles lying comparatively close to these angles are also covered.

What is claimed:

1. A VSC-converter for converting direct voltage into alternating voltage and conversely and which comprises at least one phase leg with an NPC-connection, four current valves connected in series, including at least one semiconductor device of turn-off type and a first rectifying member connected in anti-parallel therewith, in which a point on the phase leg between two inner valves of the series connection is for connection to a phase of an alternating voltage network and opposite ends of the phase leg are for connection to a pole conductor each of a direct voltage network or a direct voltage intermediate link, and in which a series connection of two second clamping rectifying members directed in the same direction with respect to said series connection as the first rectifying members are connected between on one hand to a point between one of the outer valves of the series connection and the adjacent inner valve and on the other hand to a point between the other of the outer valves in the series connection and the adjacent inner valve, and a midpoint between the two clamping rectifying members is connected to a zero potential defined by capacitors connected in series between said pole conductors, wherein at least two of the current valves and the clamping rectifying members are arranged in relatively close proximity to each other and are oriented with respect to each other so that commutation currents generate upon commutation of the converter therein will flow in substantially opposite directions.

2. The converter according to claim 1, wherein the current valves and the clamping directing members are arranged in stacks arranged in pairs and so that commutation currents generated upon commutation of the converter will flow in substantially opposite directions in stacks belonging to the same pair.

3. The converter according to claim 1, wherein each current valve and clamping rectifying member is formed by one or several stacks of substantially identical units connected in series, and said stacks are formed with a large width and adjacent stacks are arranged at short mutual distances.

4. The converter according to claim 1, comprising rails connecting the current valves and the clamping rectifying members to each other, and the rails being arranged that commutation currents generated upon commutation of the converter flow in substantially opposite directions in adjacent such rails over at least parts of the extension thereof.

5. The converter according to claim 1, wherein for at least one of the following three pairs, the two parts included therein are arranged close to each other and so that commutation currents generated upon cummutation of the converter in those belonging to the same pair flow in substantially opposite directions: a) the first outer current valve and the clamping rectifying member connected between the second outer current valve and the inner current valve adjacent thereto, b) the second outer current valve and the clamping rectifying member connected between the first outer current valve and the inner current valve adjacent thereto and c) the two inner current valves.

6. The converter according to claim 5, wherein all the pairs a), b) and c) have pair parts arranged close to each other and with said commutation current in each pair oppositely directed when they flow in a large commutation loop through an outer current valve, the inner current valve adjacent thereto, the other inner current valve and the clamping rectifying member connected to the latter.

7. The converter according to claim 1, wherein the four current valves and the clamping rectifying members are arranged substantially in a row one after the other with a clamping rectifying member arranged between each outer valve of the series connection and the inner valve connected thereto.

8. The converter according to claim 7, wherein the current valves and the clamping rectifying members are arranged to extend substantially perpendicularly to the direction of extension of said row.

9. The converter according to claim 7, wherein one outer current valve in said series connection and the inner current valve located most remotely with respect thereto are arranged substantially in parallel with each other, and that the two other current valves are arranged substantially in parallel with each other and making an angle of substantially 180° with respect to the two valves first mentioned.

10. The converter according to claim 1, wherein the two clamping rectifying members are arranged with their conducting directions making an angle of substantially 180° with each other.

11. The converter according to claim 10, wherein the respective clamping rectifying member is arranged with the conducting direction thereof making an angle of substantially 180° with the conducting direction of the first rectifying member in the outer current valve adjacent thereto.

12. The converter according to claim 7, wherein said row is folded by substantially 180° in the region of said phase terminal, so that the outer current valves come close to each other and the phase leg gets compact.

13. The converter according to claim 1, wherein each current valve includes a plurality of semiconductor devices of turn-off type connected in series and rectifying members connected in anti-parallel therewith arranged so that they form a substantially U-shape.

14. The converter according to claim 13, wherein the legs of said U are relatively thick and the distance therebetween comparatively small for reducing the inductance of the respective current valve.

15. The converter according to claim 1, wherein the different connections between the current valves and the clamping rectifying members and capacitors (19, 20) of the converter are formed by relatively low inductance rails, with a comparatively large width transversely to the longitudinal extension thereof.

16. The converter according to claim 7, wherein the connections between the current valves and the clamping rectifying members over at least the main part of the total length thereof extend substantially in the longitudinal direction of said row.

17. The converter according to claim 7, wherein said capacitors are two in number and one of them is connected to each end of said row with one plate to the outer current valve and the other plate to the clamping rectifying member adjacent thereto.

18. The converter according to claim 17, wherein one of the capacitors is connected to the opposite end of the current valve and the clamping rectifying member with respect to the second capacitor with respect to the conducting direction.

19. The converter according to claim 1, wherein the clamping rectifying members are diodes.

20. The converter according to claim 1, wherein the first rectifying members are diodes.

21. The converter according to claim 1, wherein the semiconductor devices are IGBTs.

22. The converter according to claim 1, including a plurality of phase legs for connection to a plurality of phases of an alternating voltage network.

23. The converter according to claim 1, for connection to a direct voltage network for high voltage direct current (HVDC).

* * * * *